(12) United States Patent
Mimura

(10) Patent No.: US 11,424,731 B2
(45) Date of Patent: Aug. 23, 2022

(54) ELASTIC WAVE DEVICE

(71) Applicant: Murata Manufacturing Co., Ltd., Nagaokakyo (JP)

(72) Inventor: Masakazu Mimura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1193 days.

(21) Appl. No.: 15/924,311

(22) Filed: Mar. 19, 2018

(65) Prior Publication Data

US 2018/0212586 A1    Jul. 26, 2018

Related U.S. Application Data

(63) Continuation of application No. PCT/JP2016/073303, filed on Aug. 8, 2016.

(30) Foreign Application Priority Data

Oct. 23, 2015  (JP) .............................. JP2015-208924

(51) Int. Cl.
*H03H 9/02* (2006.01)
*H03H 9/145* (2006.01)
(Continued)

(52) U.S. Cl.
CPC .......... *H03H 9/02889* (2013.01); *H03H 3/10* (2013.01); *H03H 9/02559* (2013.01);
(Continued)

(58) Field of Classification Search
CPC ........... H03H 9/02889; H03H 9/02559; H03H 9/02637; H03H 9/1092; H03H 9/145
(Continued)

(56) References Cited

U.S. PATENT DOCUMENTS

2009/0009028 A1 * 1/2009 Nishiyama ......... H03H 9/02559
310/313 B
2009/0272193 A1   11/2009 Okaguchi et al.
(Continued)

FOREIGN PATENT DOCUMENTS

JP      2012-186808 A     9/2012
JP      2013-145930 A     7/2013
(Continued)

OTHER PUBLICATIONS

Official Communication issued in International Patent Application No. PCT/JP2016/073303, dated Oct. 25, 2016.

*Primary Examiner* — Derek J Rosenau
(74) *Attorney, Agent, or Firm* — Keating & Bennett, LLP

(57) ABSTRACT

An elastic wave device includes an interdigital transducer electrode, a dielectric film, and a frequency adjustment film are disposed on a $LiNbO_3$ substrate. When Euler Angles of the $LiNbO_3$ substrate are within a range of about $0°\pm5°$, within a range of about $\theta\pm1.5°$, within a range of about $0°\pm10°$, the interdigital transducer electrode includes a main electrode, a film thickness of the main electrode normalized by a wavelength determined in accordance with an electrode finger pitch of the interdigital transducer electrode is denoted as T, and a density ratio of a material of the main electrode to Pt is denoted as r, the film thickness of the main electrode and $\theta$ of the Euler Angles satisfy $\theta=-0.05°/(T/r-0.04)+31.35°$.

18 Claims, 7 Drawing Sheets

(51) Int. Cl.
*H03H 3/10* (2006.01)
*H03H 9/25* (2006.01)
*H03H 9/10* (2006.01)
*H01L 41/047* (2006.01)

(52) U.S. Cl.
CPC ...... *H03H 9/02637* (2013.01); *H03H 9/1092* (2013.01); *H03H 9/145* (2013.01); *H03H 9/14541* (2013.01); *H03H 9/25* (2013.01); *H01L 41/0477* (2013.01)

(58) Field of Classification Search
USPC ...... 310/313 R, 313 A, 313 B, 313 C, 313 D
See application file for complete search history.

(56) References Cited

U.S. PATENT DOCUMENTS

2013/0285504 A1* 10/2013 Tamasaki ........... H03H 9/02574
  310/313 C
2013/0300519 A1  11/2013 Tamasaki et al.

FOREIGN PATENT DOCUMENTS

| | | |
|---|---|---|
| WO | 2007/125734 A1 | 11/2007 |
| WO | 2008/102577 A1 | 8/2008 |
| WO | 2012/098816 A1 | 7/2012 |

* cited by examiner

ELASTIC WAVE DEVICE

CROSS REFERENCE TO RELATED APPLICATIONS

This application claims the benefit of priority to Japanese Patent Application No. 2015-208924 filed on Oct. 23, 2015 and is a Continuation Application of PCT Application No. PCT/JP2016/073303 filed on Aug. 8, 2016. The entire contents of each application are hereby incorporated herein by reference.

BACKGROUND OF THE INVENTION

1. Field of the Invention

The present invention relates to an elastic wave device in which an interdigital transducer (IDT) electrode, a dielectric film, and a frequency adjustment film are stacked on a $LiNbO_3$ substrate.

2. Description of the Related Art

Japanese Unexamined Patent Application Publication No. 2012-186808 discloses an elastic wave device in which a Rayleigh wave is used. In the elastic wave device, on a $LiNbO_3$ substrate, a $SiO_2$ film is stacked so as to cover an interdigital transducer electrode. In addition, a SiN film for frequency adjustment is disposed on the $SiO_2$ film. The frequency of the elastic wave device is adjusted by adjusting the thickness of the SiN film.

In the elastic wave device described in Japanese Unexamined Patent Application Publication No. 2012-186808, a spurious SH (Shear Horizontal) wave response changes in accordance with a change in the film thickness of the SiN film. Therefore, when the thickness of the SiN film is changed for the purpose of adjusting the frequency, a spurious SH (Shear Horizontal) wave response that has been suppressed may occur to a great extent.

SUMMARY OF THE INVENTION

Preferred embodiments of the present invention provide elastic wave devices in which the magnitude of a spurious SH (Shear Horizontal) wave response does not readily change even when the film thickness of a frequency adjustment film is changed.

An elastic wave device according to a preferred embodiment of the present invention includes a $LiNbO_3$ substrate, an interdigital transducer electrode disposed on the $LiNbO_3$ substrate, a dielectric film disposed on the $LiNbO_3$ substrate and covering the interdigital transducer electrode, and a frequency adjustment film disposed on the dielectric film, wherein, when Euler Angles of the $LiNbO_3$ substrate are within a range of about 0°±5°, within a range of about θ±1.5°, within a range of about 0°±10°, the interdigital transducer electrode includes a main electrode, a film thickness of the main electrode normalized by a wavelength λ determined in accordance with an electrode finger pitch of the interdigital transducer electrode is denoted as T, and a density ratio of a material of the main electrode to Pt is denoted as r, the film thickness T of the main electrode and θ of the Euler Angles satisfy formula (1) described below.

$$\theta = -0.05°/(T/r - 0.04) + 31.35° \quad \text{Formula(1)}$$

In an elastic wave device according to a preferred embodiment of the present invention, θ is within a range of about 25° or more and about 31° or less. In this case, even when a film thickness of the frequency adjustment film is small, a change in a spurious SH (Shear Horizontal) wave response is able to be further effectively reduced or prevented.

In an elastic wave device according to a preferred embodiment of the present invention, the main electrode is made of a metal selected from the group consisting of Pt, Au, W, Ta, Mo, and Cu or an alloy including primarily the metal.

In an elastic wave device according to a preferred embodiment of the present invention, the film thickness of the frequency adjustment film is about 0 or more and about $0.025\lambda$ or less. In this case, a region in which the frequency adjustment sensitivity is high is able to be used. Therefore, the cost of a frequency adjustment step is able to be reduced.

In an elastic wave device according to a preferred embodiment of the present invention, the film thickness of the frequency adjustment film is about $0.005\lambda$ or less.

In an elastic wave device according to a preferred embodiment of the present invention, the dielectric film is made of silicon oxide, e.g., $SiO_2$. In this case, an absolute value of a temperature coefficient of resonant frequency TCF is able to be reduced.

In an elastic wave device according to a preferred embodiment of the present invention, the frequency adjustment film is made of silicon nitride, e.g., SiN.

In an elastic wave device according to a preferred embodiment of the present invention, the interdigital transducer electrode includes the main electrode and another electrode layer made of a metal other than the main electrode.

In an elastic wave device according to a preferred embodiment of the present invention, the elastic wave device is a band pass filter including the interdigital transducer electrode.

In an elastic wave device according to a preferred embodiment of the present invention, a total film thickness of the interdigital transducer electrode is about $0.25\lambda$ or less.

In an elastic wave device according to a preferred embodiment of the present invention, the thickness of the silicon oxide is larger than the thickness of the interdigital transducer electrode.

With elastic wave devices according to preferred embodiments of the present invention, the magnitude of a spurious SH (Shear Horizontal) wave response does not readily change even when the film thickness of a frequency adjustment film is changed.

The above and other elements, features, steps, characteristics and advantages of the present invention will become more apparent from the following detailed description of the preferred embodiments with reference to the attached drawings.

Figure 4:
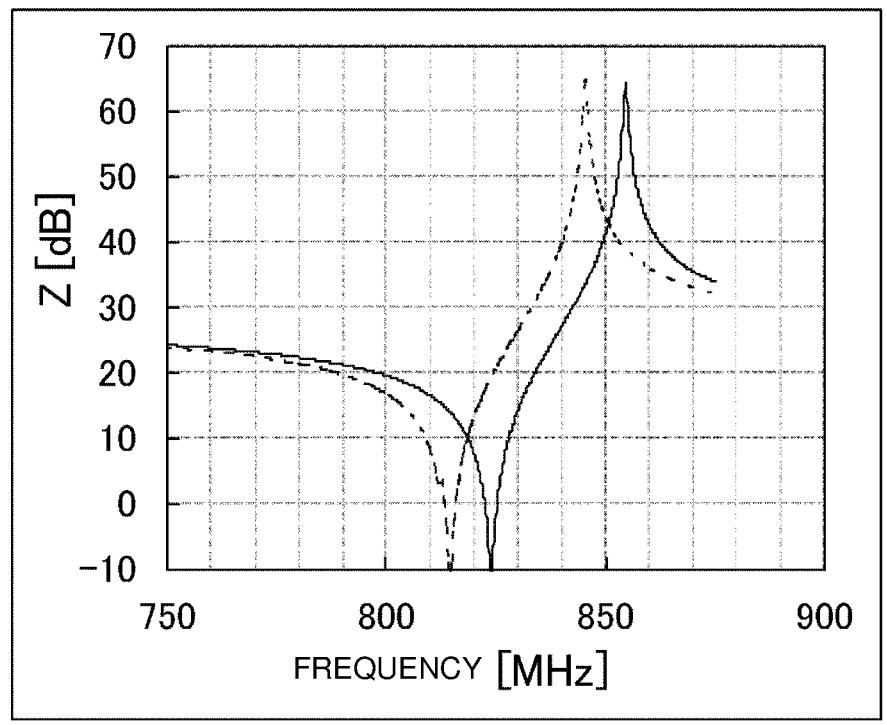

FIG. 4 is a diagram showing impedance characteristics of the S (Scattering) parameter of an elastic wave resonator in which θ of Euler Angles of a LiNbO₃ substrate is about 25° and the film thickness of a Pt film in an interdigital transducer electrode is about 0.0475λ.

Figure 5:
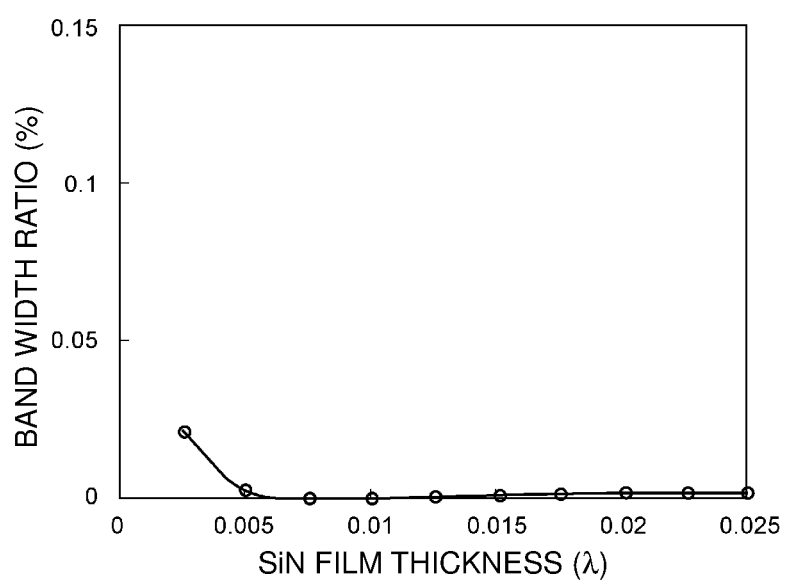

FIG. 5 is a diagram showing the relationship between the film thickness of a SiN film defining and functioning as a frequency adjustment film and the band width ratio of a SH (Shear Horizontal) wave of an elastic wave device in which θ of Euler Angles of a LiNbO₃ substrate is about 25° and the film thickness of a Pt film in an interdigital transducer electrode is about 0.0475λ.

Figure 6:
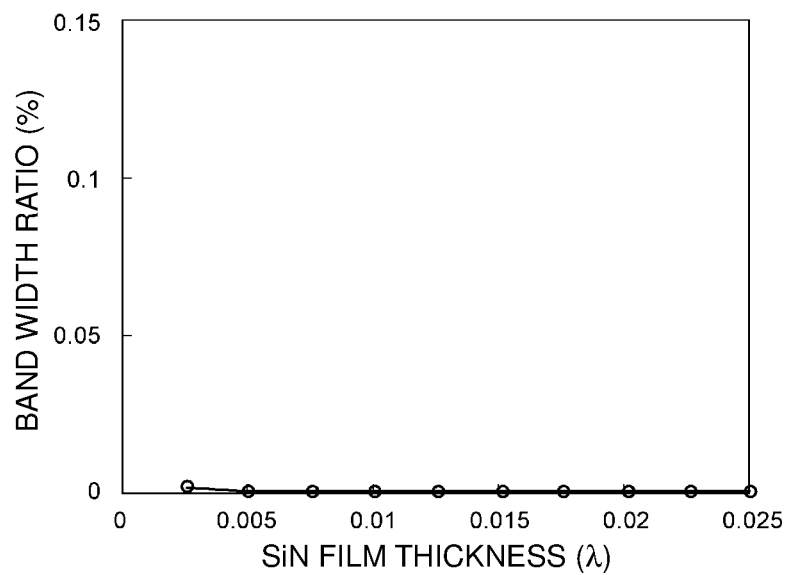

FIG. 6 is a diagram showing the relationship between the film thickness of a SiN film defining and functioning as a frequency adjustment film and the band width ratio of a SH (Shear Horizontal) wave of an elastic wave device in which θ of Euler Angles of a LiNbO₃ substrate is about 28° and the film thickness of a Pt film in an interdigital transducer electrode is about 0.055λ.

Figure 7:
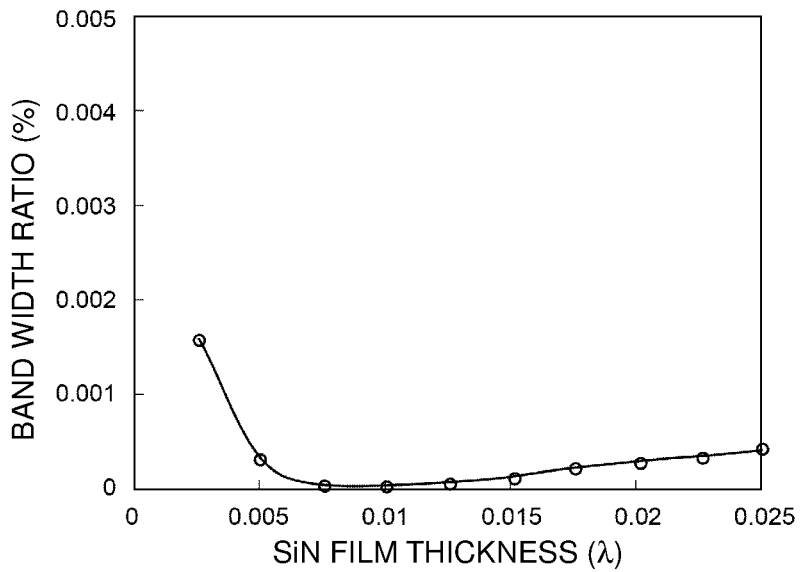

FIG. 7 is a diagram corresponding to FIG. 6 in which the vertical axis that indicates the band width ratio is scaled up.

Figure 8:
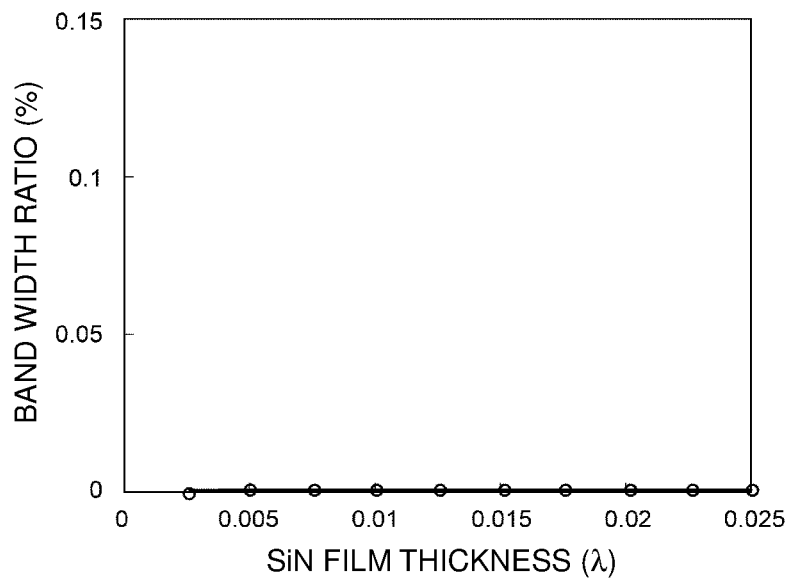

FIG. 8 is a diagram showing the relationship between the film thickness of a SiN film defining and functioning as a frequency adjustment film and the band width ratio of a SH (Shear Horizontal) wave of an elastic wave device in which θ of Euler Angles of a LiNbO₃ substrate is about 30° and the film thickness of a Pt film in an interdigital transducer electrode is about 0.0775λ.

Figure 9:
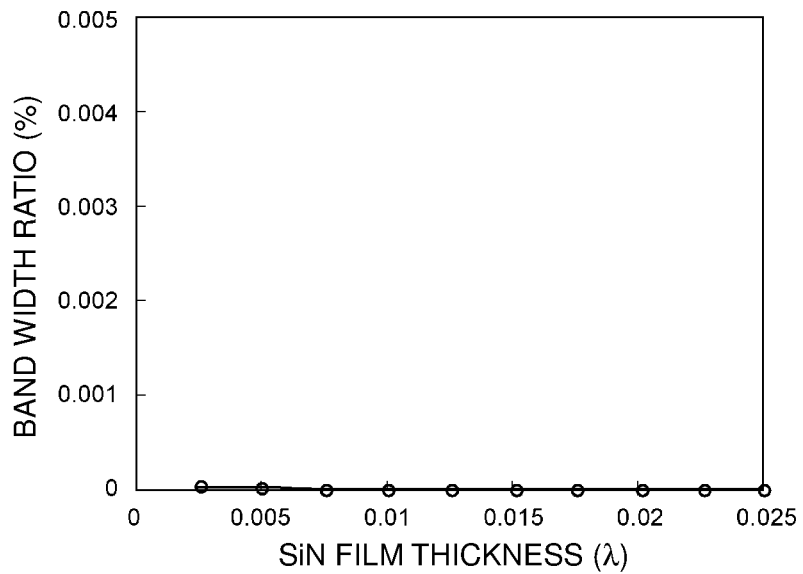

FIG. 9 is a diagram corresponding to FIG. 8 in which the vertical axis is scaled up.

Figure 10:
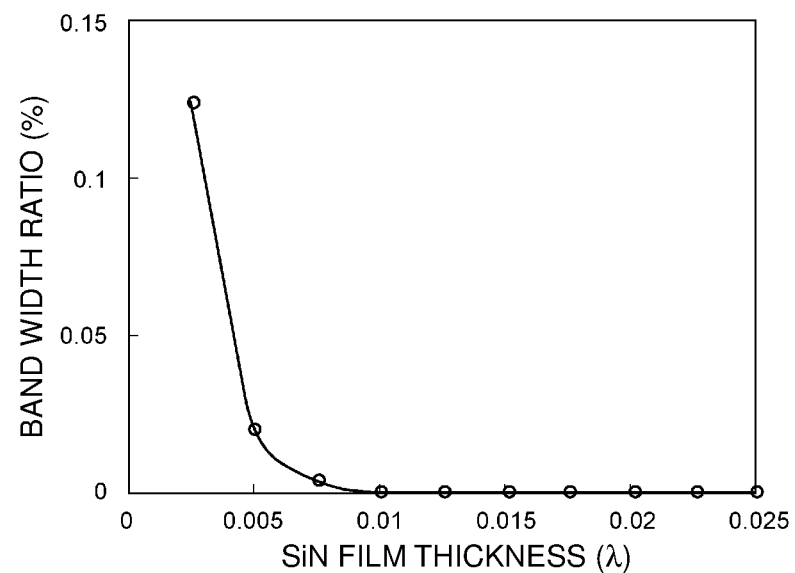

FIG. 10 is a diagram showing the relationship between the film thickness of a SiN film defining and functioning as a frequency adjustment film and the band width ratio of a SH (Shear Horizontal) wave of an elastic wave device in which θ of Euler Angles of a LiNbO₃ substrate is about 38° and the film thickness of a Pt film in an interdigital transducer electrode is about 0.02λ.

Figure 11:
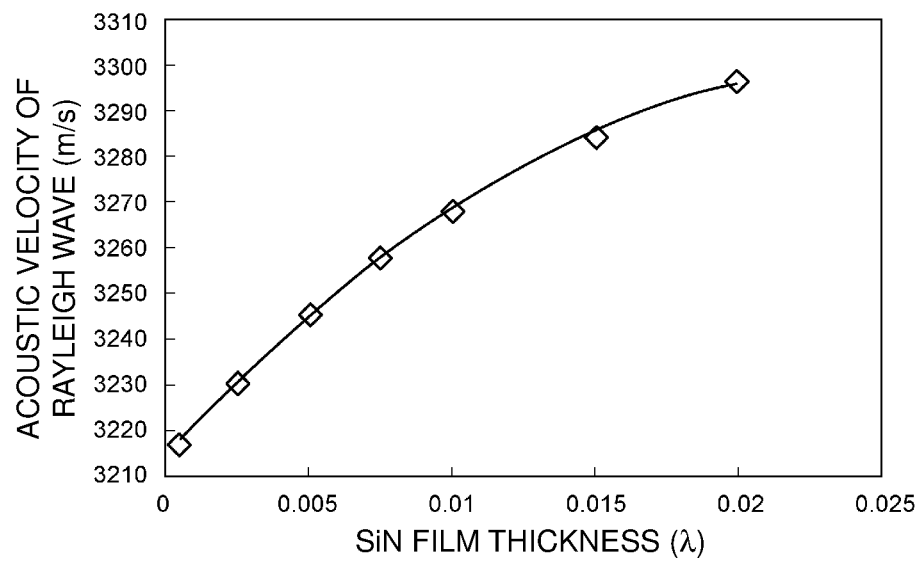

FIG. 11 is a diagram showing the relationship between the film thickness of a SiN film and the acoustic velocity of a Rayleigh wave.

Figure 12:
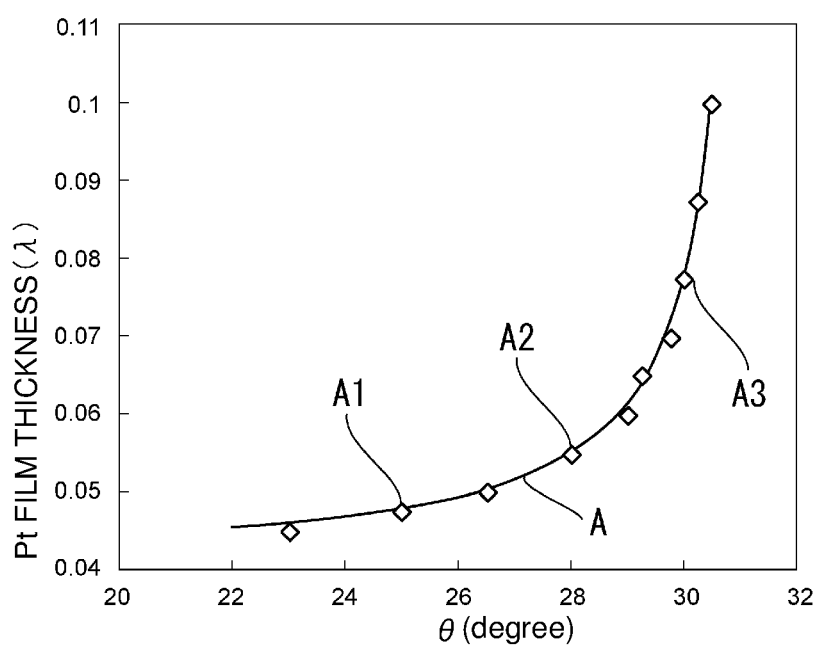

FIG. 12 is a diagram showing the relationship between θ and the film thickness of a Pt film where the band width ratio of a SH (Shear Horizontal) wave is significantly reduced or minimized.

DETAILED DESCRIPTION OF THE PREFERRED EMBODIMENTS

The specific preferred embodiments according to the present invention will be described below with reference to the drawings so as to clarify the present invention.

In this regard, it is indicated that each of the preferred embodiments described in the present specification is an exemplification and that the configuration may be partially replaced or combined with the configuration of another preferred embodiment.

Figure 1A:
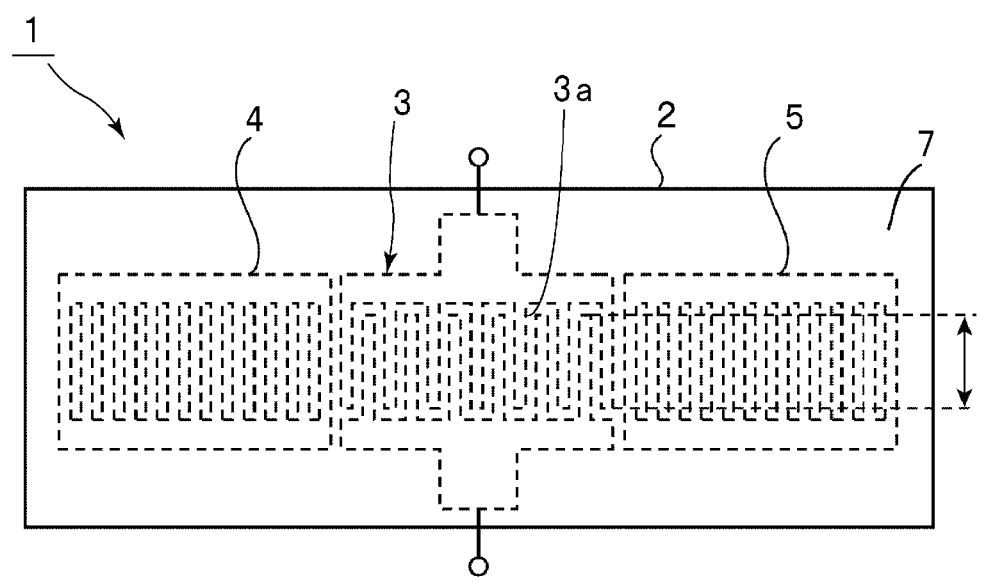
FIG. 1A is a plan view of an elastic wave device according to a preferred embodiment of the present invention.
Figure 1B:
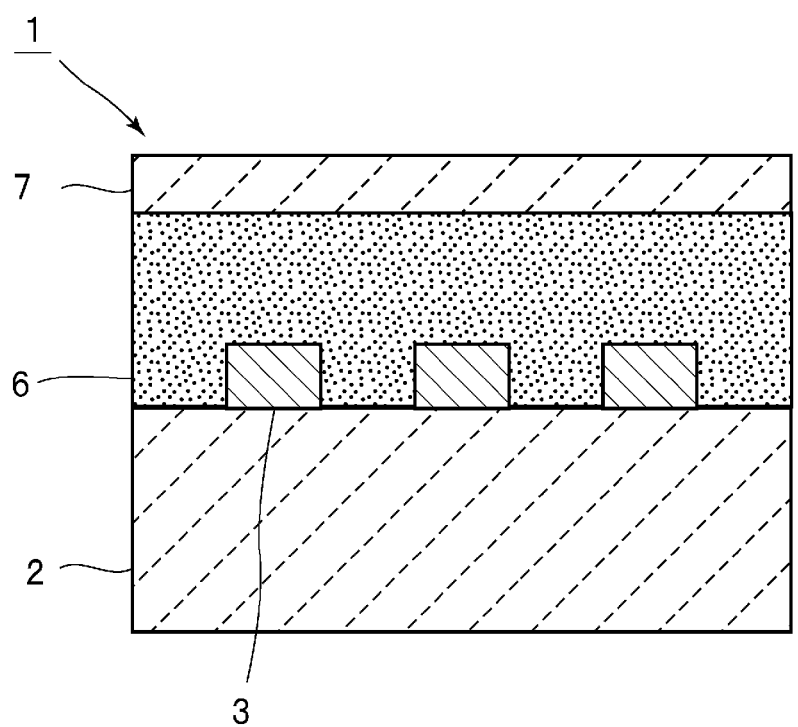
FIG. 1B is a magnified partial sectional front view showing a magnified key portion.

FIG. 1A is a plan view of an elastic wave device according to a preferred embodiment of the present invention, and FIG. 1B is a magnified partial sectional front view showing a magnified key portion.

An elastic wave device 1 includes a LiNbO₃ substrate 2. An interdigital transducer electrode 3 is disposed on the LiNbO₃ substrate 2. The interdigital transducer electrode 3 includes a plurality of electrode fingers 3a. Reflectors 4 and 5 are disposed on both sides of the interdigital transducer electrode 3 in an elastic wave propagation direction. Consequently, a one-port elastic wave resonator is provided. The elastic wave device 1 preferably utilizes a Rayleigh wave.

In the elastic wave device 1, a dielectric film 6 is disposed on the LiNbO₃ substrate 2 so as to cover the interdigital transducer electrode 3. In the present preferred embodiment, the dielectric film 6 is preferably made of SiO₂, for example.

A SiN film defining and functioning as a frequency adjustment film 7 is disposed on the dielectric film 6.

In the elastic wave device 1, the dielectric film 6 is preferably made of SiO₂ and, therefore, the absolute value of the temperature coefficient of resonant frequency TCF is set to be small. In this regard, the dielectric film 6 may be made of other dielectric materials, e.g., SiON.

The frequency of the elastic wave device 1 is able to be adjusted by adjusting the thickness of the frequency adjustment film 7. That is, the frequency is able to be adjusted in the direction of lowering the resonant frequency or the anti-resonant frequency by reducing the thickness of the frequency adjustment film 7.

The frequency adjustment film 7 is not limited to SiN and may be made of other materials, e.g., SiON. Preferably, a SiN film is used because of an appropriate acoustic velocity through the film and the ease of processing.

In the elastic wave device 1, when the interdigital transducer electrode 3 includes a main electrode, the film thickness of the main electrode is denoted T, and the density ratio of the material of the main electrode to Pt is denoted as r, Euler Angles of the LiNbO₃ substrate 2 are within a range of about 0°±5°, within a range of about θ±1.5°, within a range of about 0°±10° and the thickness T of the main electrode and θ of the Euler Angles satisfy formula (1) described below. Consequently, even when the thickness of the frequency adjustment film 7 is changed, the band width ratio of a spurious SH (Shear Horizontal) wave is reduced.

$$\theta = -0.05°/(T/r-0.04)+31.35° \quad \text{Formula(1)}$$

In the elastic wave device 1, when the film thickness of the SiN film is changed, the band width ratio of a spurious SH (Shear Horizontal) wave changes. The band width ratio of a SH (Shear Horizontal) wave is represented by the ratio of a frequency at which a SH (Shear Horizontal) wave response occurs to a difference between the resonant frequency and the anti-resonant frequency of the SH (Shear Horizontal) wave and corresponds to an electromechanical coupling coefficient. As the band width ratio increases, a SH (Shear Horizontal) wave response occurs to a great extent. This will be described with reference to FIG. 3 to FIG. 10.

Figure 3:
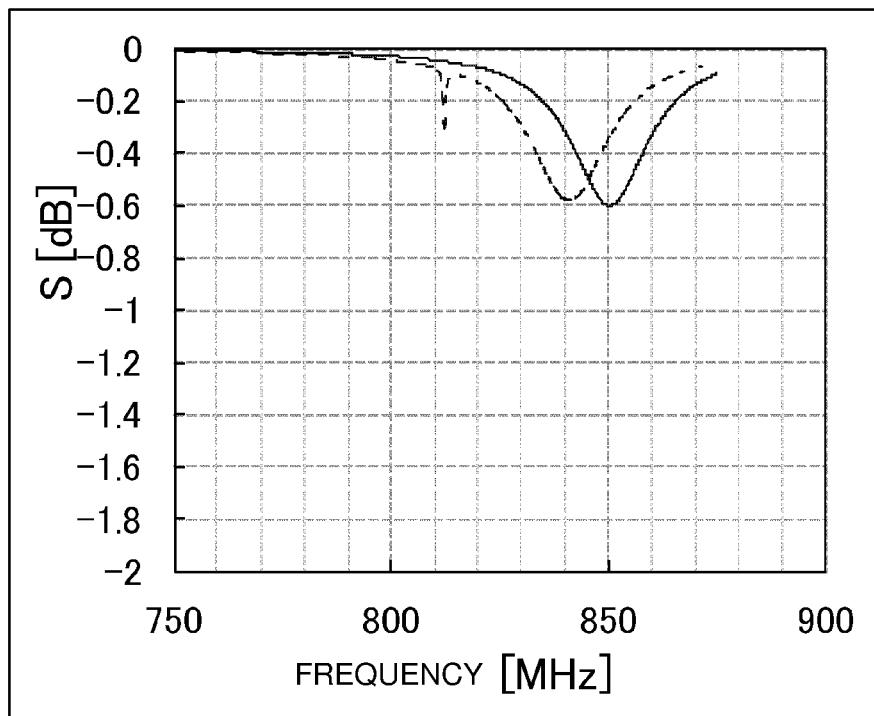
FIG. 3 is a diagram showing frequency characteristics of the S (Scattering) parameter of an elastic wave resonator in which θ of Euler Angles of a $LiNbO_3$ substrate is about 25° and the film thickness of a Pt film in an interdigital transducer electrode is about 0.0475λ.

FIG. 3 and FIG. 4 show frequency characteristics of the S (Scattering) parameter and impedance characteristics, respectively, of an elastic wave resonator produced such that θ of Euler Angles (0°, θ, 0°) of a LiNbO₃ substrate was set to be about 25°, for example, the wavelength λ determined in accordance with the electrode finger pitch of an interdigital transducer electrode 3 was set to be about 4.0 μm, for example, and the film thickness of a Pt film defining the interdigital transducer electrode was set to be about 190 nm (about 0.0475λ), for example. In each drawing, the solid line indicates the characteristics when the film thickness of a SiN film defining and functioning as a frequency adjustment film was about 40 nm (about 0.01λ), for example, and the broken line indicates the characteristics when the film thickness was about 10 nm (about 0.0025λ), for example. Regarding the characteristics indicated by the solid line, only a Rayleigh wave response was observed, whereas regarding the characteristics indicated by the broken line, a spurious SH (Shear Horizontal) wave response occurred in the vicinity of 810

MHz. This is because the band width ratio of the SH (Shear Horizontal) wave increased by changing the film thickness of the SiN film.

Subsequently, a plurality of types of elastic wave devices were produced where θ of Euler Angles (0°, θ, 0°) of a LiNbO$_3$ substrate and the film thickness of a Pt film defining the interdigital transducer electrode 3 were variously changed. Regarding the plurality of types of elastic wave devices, the film thickness of the SiN film defining and functioning as a frequency adjustment film was changed and changes in the band width ratio of the SH (Shear Horizontal) wave were determined. FIG. 5 shows the results of the case when θ of Euler Angles was about 25° and the film thickness of the Pt film was about 0.0475λ, for example. In this regard, λ is a wavelength determined in accordance with the electrode finger pitch of the interdigital transducer electrode 3.

As is clear from FIG. 5, when the film thickness of the SiN film is more than about 0.005λ, the band width ratio of the SH (Shear Horizontal) wave is almost 0. On the other hand, when the film thickness of the SiN film is about 0.005λ or less, as the film thickness of the SiN film is reduced, the band width ratio increases and, as a result, a spurious SH (Shear Horizontal) wave may occur in the device characteristics. Therefore, when θ is about 25° and the film thickness of the Pt film is about 0.0475λ, for example, it is preferable that the frequency be adjusted by changing the film thickness of the SiN film, where the film thickness of the SiN film is set to be within the range of about 0.005λ or more, for example.

FIG. 6 shows the results of the case in which θ is about 28° and the film thickness of the Pt film is about 0.055λ, and FIG. 7 is a diagram corresponding to FIG. 6 in which the vertical axis that indicates the band width ratio is scaled up. As is clear from FIG. 6 and FIG. 7, in the case in which θ is about 28° and the film thickness of the Pt film is about 0.055λ, the band width ratio of the SH (Shear Horizontal) wave is 0 when the film thickness of the SiN film is about 0.0075λ. As is also clear from FIG. 7, the band width ratio of the SH (Shear Horizontal) wave is about 0.002% or less when the film thickness of the SiN film is within the range of about 0.0025λ or more and about 0.025λ or less, for example.

FIG. 8 is a diagram showing the relationship between the film thickness of the SiN film and the band width ratio of the SH (Shear Horizontal) wave when θ of Euler Angles of a LiNbO$_3$ substrate is about 30° and the film thickness of the Pt film is about 0.0775λ, and FIG. 9 is a diagram corresponding to FIG. 8 in which the vertical axis is scaled up.

In this case, as is also clear from FIG. 8 and FIG. 9, the band width ratio of the SH (Shear Horizontal) wave is almost 0 when the film thickness of the SiN film is within the range of about 0.0025λ or more and about 0.025λ or less, for example.

FIG. 10 shows the relationship between the film thickness of the SiN film and the band width ratio of the SH (Shear Horizontal) wave when θ of Euler Angles is about 38° and the film thickness of the Pt film is about 0.02λ where the condition is the same as the condition disclosed in Japanese Unexamined Patent Application Publication No. 2012-186808 except for the relationship between θ and the film thickness of the electrode. As is clear from FIG. 10, when the film thickness of the SiN film is about 0.01λ or less, the band width ratio of the SH (Shear Horizontal) wave increases as the film thickness of the SiN film is reduced. It is clear that when the frequency is adjusted by reducing the film thickness of the SiN film so as to set the film thickness of the SiN film to fall within the range of about 0.01λ or less, the magnitude of the band width ratio of the SH (Shear Horizontal) wave changes to a great extent. Therefore, the configuration disclosed in Japanese Unexamined Patent Application Publication No. 2012-186808 cannot reliably provide an elastic wave device that has a narrow range of variations in characteristics.

On the other hand, in the examples shown in FIG. 3 to FIG. 9, it is clear that even when the frequency is adjusted by reducing the film thickness of the SiN film to about 0.025λ or less, and more preferably about 0.005λ or less, for example, the magnitude of the band width ratio of the SH (Shear Horizontal) wave changes to a very small extent. In this regard, if the film thickness of the SiN film is 0λ, no frequency adjustment function is performed. Therefore, the film thickness of the SiN film is more than 0.

FIG. 11 is a diagram showing the relationship between the film thickness of the SiN film and the acoustic velocity of a Rayleigh wave. As is clear from FIG. 11, the relationship between the film thickness of the SiN film and the acoustic velocity of a Rayleigh wave is represented by a curve that is downwardly concave, and the frequency changes to a great extent relative to a change in the film thickness of the SiN film, that is, the sensitivity to the frequency adjustment increases, as the film thickness of the SiN film is reduced. In recent years, further reduction in the cost of the elastic wave device has been required. Therefore, in a frequency adjustment step, a condition under which the sensitivity to the frequency adjustment is high has been required. That is, it is preferable that the frequency adjustment be performed while the film thickness of the SiN film is significantly reduced or minimized.

As described above, even when the frequency adjustment is performed by selecting θ of Euler Angles of the LiNbO$_3$ substrate and the film thickness of the Pt film such that the film thickness of the SiN film is reduced to fall within the range of about 0.025λ or less, and more preferably within the range of about 0.005λ or less, for example, a change in the magnitude of spurious SH (Shear Horizontal) wave response is able to be reduced.

In consideration of the above-described points, the inventors of preferred embodiments of the present invention variously changed the film thickness of the Pt film and θ of Euler Angles of the LiNbO$_3$ substrate 2, in addition to FIG. 3 to FIG. 9 described above, and determined the band width ratios of the SH (Shear Horizontal) wave in those cases. Table 1 described below shows combinations of θ of Euler Angles and the film thickness of the Pt film when the band width ratio of the SH (Shear Horizontal) wave could be significantly reduced or minimized.

TABLE 1

| Pt film thickness [λ] | θ [degree] |
|---|---|
| 0.045 | 23 |
| 0.0475 | 25 |
| 0.05 | 26.5 |
| 0.055 | 28 |
| 0.06 | 29 |
| 0.065 | 29.25 |
| 0.07 | 29.75 |
| 0.0775 | 30 |
| 0.0875 | 30.25 |
| 0.0975 | 30.5 |
| 0.1 | 30.5 |

FIG. 12 shows plots of the results shown in Table 1.

In this regard, point A1 in FIG. 12 corresponds to the case in which θ of Euler Angles is about 25° and the film thickness of the Pt film is about 0.0475λ, that is, corresponds to the result shown in FIG. 5. Point A2 corresponds to the case in which θ of Euler Angles is about 28° and the film thickness of the Pt film is about 0.055λ, that is, corresponds to the result shown in FIG. 6. Point A3 corresponds to the case in which θ of Euler Angles is about 30° and the film thickness of the Pt film is about 0.0775λ, that is, corresponds to the result shown in FIG. 8.

Therefore, when the condition falls on solid line A shown in FIG. 12, the band width ratio of the SH (Shear Horizontal) wave is able to be significantly reduced or minimized. Solid line A is represented by formula (1A).

$$\theta=-0.05°/(T_{pt}-0.04)+31.35° \quad \text{Formula(1A)}$$

That is, when the film thickness of the Pt film is denoted as $T_{pt}$ and the film thickness $T_{pt}$ and θ of Euler Angles satisfy formula (1A) described above, the band width ratio of the SH (Shear Horizontal) wave is able to be significantly reduced or minimized. The inventors of preferred embodiments of the present invention also performed various investigations on materials, other than Pt, for the main electrode. That is, the same investigations were performed on Au, W, Ta, Mo, and Cu. As a result, it was discovered that, when these metals were used and a film thickness normalized by a wavelength determined in accordance with the electrode finger pitch of the interdigital transducer electrode 3 was denoted as T, T/r could be used in place of $T_{pt}$ in formula (1A) described above. In this regard, r is the density ratio of the material of the main electrode to Pt. Therefore, when the main electrode is made of Pt, r=1, and when the main electrode is made of a metal having a higher density than Pt, r>1. Consequently, the band width ratio of the SH (Shear Horizontal) wave is able to be significantly reduced or minimized by selecting θ of Euler Angles and the film thickness T of the main electrode so as to satisfy formula (1) described above. Therefore, an influence of a SH (Shear Horizontal) wave response due to a change in the film thickness of the SiN film is effectively reduced or prevented. As a result, the frequency adjustment is able to be performed with high precision and, in addition, variations in the characteristics of the elastic wave device do not readily occur.

Preferably, θ of Euler Angles is set to be within the range of about 25° or more and about 31° or less, for example. As is clear from FIG. 5 to FIG. 9, when the film thickness of the SiN film is reduced, a change in the band width ratio of the SH (Shear Horizontal) wave increases as θ of Euler Angles decreases. However, when θ is about 25° or more, the band width ratio of the SH (Shear Horizontal) wave is sufficiently reduced at the film thickness of the SiN film of about 0.005λ, for example. Consequently, a spurious SH (Shear Horizontal) wave response is more effectively reduced or prevented. On the other hand, as shown in FIG. 12, the film thickness of the main electrode of the interdigital transducer electrode is increased when θ is increased. If the film thickness of the main electrode is excessively increased, the cost may increase or variations in the characteristics may increase when variations between the widths of the electrode fingers increase. Therefore, $T_{pt}$ is more preferably set to be about 0.1λ or less, for example, for the above-described reason. As a result, θ is more preferably set to be within the range of about 30.5° or less, for example.

Meanwhile, as shown in FIG. 11, the amount of acoustic velocity changed due to a change in the film thickness of the SiN film increases as the film thickness of the SiN film is reduced. That is, the sensitivity to the frequency adjustment increases as the film thickness of the SiN film is reduced. Consequently, a wide frequency adjustment range is able to be obtained by performing the frequency adjustment in a range in which the film thickness of the SiN film is as small as about 0.01λ or less in the same or similar manner as the above-described preferred embodiment.

In this regard, the frequency adjustment is able to be performed by etching the SiN film or by adjusting the thickness when the SiN film is formed. The time of the above-described etching or film formation is able to be reduced by using a small thickness region of the SiN film, as described above. As a result, the production cost is also able to be reduced.

In the above-described preferred embodiment, the frequency adjustment is able to be performed by using a SiN film thickness region in which the sensitivity to the frequency adjustment is high, as described above. The film thickness of the above-described SiN film is preferably more than 0 and about 0.025λ or less, more preferably about 0.01λ or less, and further preferably about 0.005λ or less, for example. Consequently, the sensitivity to the frequency adjustment is able to be more effectively improved.

There is no particular limitation regarding the thickness of the $SiO_2$ film defining and functioning as a dielectric film, and the thickness may be larger than the thickness of the interdigital transducer electrode and be about 0.6λ or less, for example. When the thickness of the $SiO_2$ film is within this range, good frequency temperature characteristics are able to be acquired. In addition, a reduction in resonant frequency does not readily occur.

Figure 2:
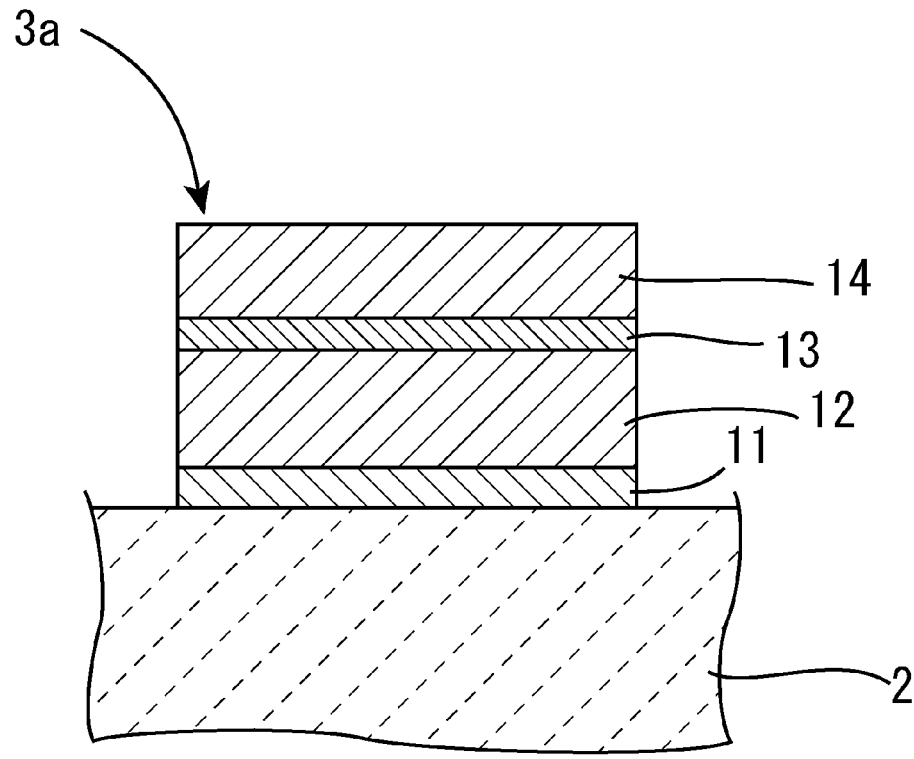
FIG. 2 is a magnified sectional view showing an electrode finger of an interdigital transducer electrode in an elastic wave device according to a modified example of a preferred embodiment of the present invention.

The interdigital transducer electrode 3 may preferably be a single-layer electrode made of a main electrode material, e.g., Pt, but may also be defined by a multilayer metal film. For example, the interdigital transducer electrode 3 may have a structure in which a NiCr film 11, a Pt film 12 defining and functioning as a main electrode, a Ti film 13 defining and functioning as a diffusion-preventing film, and an AlCu alloy film 14 that improves the electrical conductivity are stacked, in the same or similar manner as a modified example shown in FIG. 2, in which a magnified portion of an electrode finger 3a is shown.

The Pt film 12 is a main electrode. The main electrode is an electrode layer that has the largest mass in the interdigital transducer electrode and is an electrode that enable acquisition of sufficiently large Rayleigh wave response and reflection when disposed on the $LiNbO_3$ substrate 2. Regarding a material that defines such a main electrode, preferably, a metal selected from the group consisting of Pt, Au, W, Ta, Mo, and Cu or an alloy including primarily the metal may preferably be used. The alloy including primarily the metal refers to an alloy in which the content of the metal is more than about 50% by weight, for example.

The NiCr film 11 firmly bonds the Pt film 12 defining and functioning as the main electrode to the $LiNbO_3$ substrate 2. That is, the NiCr film 11 is a close-contact layer. The close-contact layer is not limited to the NiCr film, and a Ti film, a Ni film, a Cr film, and other suitable films, for example, may be used.

The Ti film 13 reduces or prevents mutual diffusion between the Pt film 12 defining and functioning as the main electrode and the AlCu alloy film 14. This film is not limited to the Ti film, and a Ni film, a Cr film, a NiCr film and other suitable films, for example, may be used.

The AlCu alloy film 14 reduces the electric resistance of the interdigital transducer electrode 3. An appropriate metal having higher electrical conductivity than the main electrode may be used, instead of the AlCu alloy film 14.

There is no particular limitation regarding the total film thickness of the interdigital transducer electrode including the main electrode, the close-contact layer, the diffusion-preventing film, and the AlCu alloy film, but about 0.25λ or less is preferable because if the thickness of the electrode is increased, the aspect ratio of the electrode increases and formation becomes difficult.

Even when the multilayer metal film is used, a change in the SH (Shear Horizontal) wave response is able to be effectively reduced or prevented by a change in the thickness of the frequency adjustment film when the thickness T of the main electrode and θ of Euler Angles satisfy formula (1) described above, in the same or similar manner as the above-described preferred embodiment.

In addition, in the above-described preferred embodiment, a one-port elastic wave resonator is described. However, the elastic wave devices according to preferred embodiments of the present invention are not limited to the one-port elastic wave resonator. The elastic wave devices may be, for example, band pass filters, e.g., a longitudinally coupled resonator elastic wave filter including a plurality of interdigital transducer electrodes, and a ladder filter including a plurality of elastic wave resonators. Also, the elastic wave devices according to preferred embodiments of the present invention may be applied to a band elimination filter and a trap filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a LiNbO$_3$ substrate;
an interdigital transducer electrode disposed on the LiNbO$_3$ substrate;
a dielectric film disposed on the LiNbO$_3$ substrate and covering the interdigital transducer electrode; and
a frequency adjustment film disposed on the dielectric film; wherein
the interdigital transducer electrode includes a main electrode;
the main electrode is made of a metal selected from the group consisting of Pt, W, Ta and Mo or an alloy including primarily the metal;
when the LiNbO$_3$ substrate has Euler Angles of (0°±5°, θ±1.5°, 0°±10°), a film thickness of the main electrode normalized by a wavelength λ determined in accordance with an electrode finger pitch of the interdigital transducer electrode is denoted T, and a density ratio of the metal of the main electrode to Pt is denoted as r, the film thickness T of the main electrode and θ of the Euler Angles satisfy θ=−0.05°/(T/r−0.04)+31.35°.

2. The elastic wave device according to claim 1, wherein θ is within a range of about 25° or more and about 31° or less.

3. The elastic wave device according to claim 1, wherein a film thickness of the frequency adjustment film is about 0 or more and about 0.025λ or less.

4. The elastic wave device according to claim 3, wherein the film thickness of the frequency adjustment film is about 0.005λ or less.

5. The elastic wave device according to claim 1, wherein the dielectric film is made of silicon oxide.

6. The elastic wave device according to claim 1, wherein the frequency adjustment film is made of silicon nitride.

7. The elastic wave device according to claim 1, wherein the interdigital transducer electrode includes the main electrode and another electrode layer made of a metal other than the metal of the main electrode.

8. The elastic wave device according to claim 1, wherein the elastic wave device is a band pass filter including the interdigital transducer electrode.

9. The elastic wave device according to claim 1, wherein a total film thickness of the interdigital transducer electrode is about 0.25λ or less.

10. The elastic wave device according to claim 5, wherein a thickness of the silicon oxide is larger than a thickness of the interdigital transducer electrode.

11. The elastic wave device according to claim 9, wherein reflectors are disposed on both sides of the interdigital transducer electrode in an elastic wave propagation direction.

12. The elastic wave device according to claim 1, wherein the dielectric film is made of SiO$_2$.

13. The elastic wave device according to claim 1, wherein the interdigital transducer electrode includes the main electrode, a close-contact layer, and a diffusion-preventing layer.

14. The elastic wave device according to claim 13, wherein the close-contact layer is made of NiCr.

15. The elastic wave device according to claim 13, wherein the diffusion-preventing layer is made of Ti.

16. The elastic wave device according to claim 13, wherein the interdigital transducer electrode further includes an AlCu alloy film.

17. The elastic wave device according to claim 13, wherein the close-contact layer, the main electrode, and the diffusion-preventing layer are stacked in order from the LiNbO$_3$ substrate.

18. The elastic wave device according to claim 17, wherein an AlCu alloy film is disposed on the main electrode with the diffusion-preventing layer interposed therebetween.

* * * * *